(12) United States Patent
Schwöbel et al.

(10) Patent No.: US 12,059,739 B2
(45) Date of Patent: Aug. 13, 2024

(54) METHOD FOR PRODUCING A METAL-CERAMIC SUBSTRATE

(71) Applicant: Heraeus Deutschland GmbH & Co. KG, Hanau (DE)

(72) Inventors: Andre Schwöbel, Hanau (DE); Anton-Zoran Miric, Hanau (DE); Richard Wacker, Hanau (DE); Daniel Schnee, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 249 days.

(21) Appl. No.: 17/808,908

(22) Filed: Jun. 24, 2022

(65) Prior Publication Data

US 2022/0410299 A1 Dec. 29, 2022

(30) Foreign Application Priority Data

Jun. 29, 2021 (EP) .................... 21182216

(51) Int. Cl.
- F24H 3/00 (2022.01)
- B23K 1/008 (2006.01)
- B23K 1/20 (2006.01)
- H01L 21/60 (2006.01)

(52) U.S. Cl.
CPC ............ B23K 1/20 (2013.01); B23K 1/008 (2013.01); *H01L 2021/60015* (2013.01)

(58) Field of Classification Search
CPC .. B23K 1/20; B23K 1/008; H01L 2021/60015
USPC ....................................... 165/210
See application file for complete search history.

(56) References Cited

U.S. PATENT DOCUMENTS

| | | | |
|---|---|---|---|
| 3,744,120 A | 7/1973 | Burgess et al. | |
| 3,766,634 A | 10/1973 | Babcock et al. | |
| 4,483,810 A | 11/1984 | Bunk et al. | |
| 5,141,379 A | 8/1992 | Warga | |
| 2020/0128664 A1 | 4/2020 | Harada et al. | |
| 2020/0384579 A1 | 12/2020 | Britting et al. | |

FOREIGN PATENT DOCUMENTS

| | | | |
|---|---|---|---|
| CN | 109108525 A | * | 1/2019 |
| CN | 211688841 U | * | 10/2020 |
| DE | 3931156 A1 | * | 3/1990 |
| DE | 102015108668 A1 | | 12/2016 |
| DE | 102017114893 A1 | | 1/2019 |
| JP | 3931156 A1 | * | 10/1987 |
| JP | 62227593 A | * | 10/1987 |
| JP | H046179 A | | 1/1992 |
| JP | H07187839 A | | 7/1995 |
| JP | 2003286087 A | | 10/2003 |
| JP | 4812985 B2 | | 9/2011 |
| WO | 2022244769 A1 | | 11/2022 |

OTHER PUBLICATIONS

Gao, L. et al., "Refractory Material Technology In Cement Industry", Beijing: Metallurgical Industry Press, 11 pages (2009).
Koleňák, et al., "Soldering of Ceramic Materials Using Ultrasonic Energy", Welding in the world, vol. 49 (2005) pp. 846-853, Jul. 1, 2005, Springer.

* cited by examiner

Primary Examiner — Davis D Hwu
(74) Attorney, Agent, or Firm — Blank Rome LLP

(57) ABSTRACT

The present invention relates to a method for producing a metal-ceramic substrate. The method has the following steps: providing a stack containing a ceramic body, a metal foil, and a solder material in contact with the ceramic body and the metal foil, wherein the solder material has: a metal having a melting point of at least 700° C., a metal having a melting point of less than 700° C., and an active metal; and heating the stack, wherein at least one of the following conditions is satisfied: the high temperature heating duration is no more than 60 min; the peak temperature heating duration is no more than 30 min; the heating duration is no more than 60 min.

20 Claims, No Drawings

METHOD FOR PRODUCING A METAL-CERAMIC SUBSTRATE

CROSS-REFERENCE TO RELATED APPLICATIONS

This application claims priority pursuant to 35 U.S.C. 119(a) to European Patent Application No. 21182216.8, filed Jun. 29, 2021, which application is incorporated herein by reference in its entirety.

DESCRIPTION

The present invention relates to a method for producing a metal-ceramic substrate.

Metal-ceramic substrates play an important role in the field of power electronics. They are a crucial element in the design of electronic components, and ensure a rapid dissipation of large amounts of heat during the operation of these components. Metal-ceramic substrates usually consist of a ceramic layer and a metal layer which is connected to the ceramic layer.

Several methods are known from the prior art for connecting the metal layer to the ceramic layer. In what is known as the direct copper bonding (DCB) method, a copper foil is provided superficially with a copper compound (usually copper oxide) by reaction of copper with a reactive gas (usually oxygen), said copper compound having a lower melting point than copper. If the copper foil treated in this way is applied to a ceramic body and the composite is fired, the copper compound melts and wets the surface of the ceramic body so that a stable material connection occurs between the copper foil and the ceramic body. This method is described in U.S. Pat. No. 3,744,120 A or DE 2319854 C2, for example.

Despite obvious advantages, the DCB method has two major disadvantages. Firstly, the method must be implemented at relatively high temperatures, namely somewhat below the melting point of copper. Secondly, the method may be used only for oxide-based ceramics, such as aluminum oxide, or superficially oxidized aluminum nitride. Therefore, there is a need for an alternative method for producing metal-ceramic substrates under less stringent conditions. In an alternative method, metal foils can be connected to ceramic bodies at temperatures of approximately 650 to 1000° C., wherein a special solder is used which contains a metal with a melting point of at least 700° C. (usually silver) and an active metal. The role of the active metal is to react with the ceramic material, and thus to enable a connection of the ceramic material with the remaining solder to form a reaction layer, whereas the metal with a melting point of at least 700° C. serves to connect this reaction layer to the metal foil. For example, JP4812985 B2 proposes connecting a copper foil to a ceramic body using a solder which contains 50 to 89 percent by weight silver and moreover copper, bismuth, and an active metal. With this method, it is possible to reliably join the copper foil with the ceramic body. In order to avoid problems associated with the migration of silver, it may be advantageous to use silver-free solders for connecting metal foils with ceramic bodies. These solders are, for example, based on high-melting metals (in particular copper), low-melting metals (such as bismuth, indium, or tin), and active metals (such as titanium). Such a technique is proposed in DE 102017114893 A1, for example. Basically, this technique leads to a new, independent class of connection, since the basis of the solders that are used is formed by a different metal (copper instead of silver), which leads to changed material properties and results in an adaptation with regard to the other solder components and modified joining conditions. The metal-ceramic substrates produced in this way therefore have, in addition to a metal layer and a ceramic layer, a bonding layer situated between the metal layer and the ceramic layer, which bonding layer contains an active metal.

Due to the steadily increasing demands in the field of power electronics, there is also a growing need to further improve the thermal and current conductivity of metal-ceramic substrates which are produced using a solder material containing a metal having a melting point of at least 700° C., a metal having a melting point of less than 700° C., and an active metal.

Previous approaches to increasing the thermal and current conductivity of metal-ceramic substrates were concentrated on varying the composition of the bonding layer between the metal layer and the ceramic layer. However, it may be advantageous for several reasons that the composition of the bonding layer remains unchanged. Thus, for example, a given composition of the bonding layer may ideally satisfy technical requirements other than the thermal and current conductivity, can be easily produced, or may be even more cost-effective. It would therefore be advantageous to improve the thermal and current conductivity of metal-ceramic substrates for a given composition of the bonding layer via suitable process measures.

The object of the present invention is therefore to provide a method with which a metal-ceramic substrate with increased thermal and current conductivity can be obtained using a solder material containing a metal having a melting point of at least 700° C., a metal having a melting point of less than 700° C., and an active metal.

This object is achieved via the method of claim 1. The invention therefore provides a method for producing a metal-ceramic substrate, said method comprising the steps of:

a) providing a stack containing
   a1) a ceramic body,
   a2) a metal foil, and
   a3) a solder material in contact with the ceramic body and the metal foil, wherein the solder material comprises:
      (i) a metal having a melting point of at least 700° C.,
      (ii) a metal having a melting point of less than 700° C., and
      (iii) an active metal; and b) heating the stack, wherein at least one of the following conditions is satisfied:
   b1) the high temperature heating duration is no more than 60 min, wherein the high temperature heating duration refers to the duration in which the stack is exposed, upon heating, to a temperature that corresponds to at least the peak temperature −250° C.;
   b2) the peak temperature heating duration is no more than 30 min, wherein the peak temperature heating duration refers to the duration in which the stack is exposed, upon heating, to a temperature that corresponds to at least the peak temperature −50° C.;
   b3) the heating duration is no more than 60 min, wherein the heating duration denotes the period of time that the stack needs to reach the peak temperature, starting from a temperature of 100° C.

In the method according to the invention, a stack is initially provided that contains a ceramic body, a metal foil, and a solder material that is in contact with the ceramic body and the metal foil.

The solder material is therefore preferably located between the ceramic body and the metal foil in the stack. According to a preferred embodiment, the stack contains a ceramic body, a (first) metal foil, a (first) solder material in contact with the ceramic body and the first metal foil, a second metal foil, and a second solder material in contact with the ceramic body and the second metal foil. According to this embodiment, a (first) solder material is preferably located between the ceramic body and the (first) metal foil, and a second solder material is preferably located between the ceramic body and the second metal foil. Furthermore, according to this embodiment, the first solder material preferably corresponds to the second solder material.

The ceramic body therefore preferably has a first surface and a second surface. The metal foil preferably has a first surface. The second metal foil—insofar as it is present—preferably has a first surface. According to a preferred embodiment, in the stack the (first) solder material is therefore located between the first surface of the ceramic body and the first surface of the (first) metal foil. According to a further preferred embodiment, the stack contains a second solder material in contact with the second surface of the ceramic body and the first surface of the second metal foil. According to this embodiment, in the stack the (first) solder material is preferably located between the first surface of the ceramic body and the first surface of the (first) metal foil, and the second solder material is preferably located between the second surface of the ceramic body and the first surface of the second metal foil. According to a further preferred embodiment, no further layer, in addition to the solder material according to the invention, is located between the ceramic body and the (first) metal foil. According to yet another embodiment, in addition to the solder material according to the invention, no further layer is located between the ceramic body and the second metal foil, insofar as it is present.

The ceramic of the ceramic body is preferably an insulating ceramic. According to a preferred embodiment, the ceramic is selected from the group consisting of oxide ceramics, nitride ceramics, and carbide ceramics. According to a further preferred embodiment, the ceramic is selected from the group consisting of metal oxide ceramics, silicon oxide ceramics, metal nitride ceramics, silicon nitride ceramics, boron nitride ceramics, and boron carbide ceramics. According to a particularly preferred embodiment, the ceramic is selected from the group consisting of aluminum nitride ceramics, silicon nitride ceramics, and aluminum oxide ceramics (such as, for example, zirconia toughened alumina (ZTA) ceramics). The ceramic body preferably has a thickness of 0.05-10 mm, more preferably in the range from 0.1-0.5 mm, and particularly preferably in the range from 0.15-3 mm.

The metal of the metal foil is preferably selected from the group consisting of copper, aluminum, and molybdenum. According to a particularly preferred embodiment, the metal of the metal foil is selected from the group consisting of copper and molybdenum. According to an especially preferred embodiment, the metal of the metal foil is copper. The metal foil preferably has a thickness in the range from 0.01-10 mm, more preferably in the range from 0.03-5 mm, and particularly preferably in the range from 0.05-3 mm.

The solder material comprises (i) a metal having a melting point of at least 700° C., (ii) a metal having a melting point of less than 700° C., and (iii) an active metal.

According to a preferred embodiment, (i) the metal having a melting point of at least 700° C., (ii) the metal having a melting point of less than 700° C., and (iii) the active metal are present as a constituent of at least one metal component. Therefore, the solder material preferably comprises at least one metal component which comprises (i) the metal having a melting point of at least 700° C., (ii) the metal having a melting point of less than 700° C., and (iii) the active metal. For example, it may be preferred that the solder material comprises: a metal component (i) containing a metal having a melting point of at least 700° C., a metal component (ii) containing a metal having a melting point of less than 700° C., and a metal component (iii) containing an active metal. Furthermore, it may also be preferred that the solder material comprises: a metal component (i) containing a member from the group consisting of (i) a metal having a melting point of at least 700° C., (ii) a metal having a melting point of less than 700° C., and (iii) an active metal; and a metal component (ii) comprising members from the group consisting of (i) a metal having a melting point of at least 700° C., (ii) a metal having a melting point of less than 700° C., and (iii) an active metal, said members not being contained in metal component (i). The term "metal component" is not further limited. In addition to metals and metal alloys, it also comprises metal compounds, such as intermetallic phases and other compounds, such as metal hydrides. According to a preferred embodiment, the metal component is therefore selected from the group consisting of metals, metal alloys, and metal compounds.

The solder material comprises (i) a metal having a melting point of at least 700° C. The metal having a melting point of at least 700° C. preferably has a melting point of at least 850° C., and particularly preferably a melting point of at least 1000° C. According to a preferred embodiment, the metal having a melting point of at least 700° C. is selected from the group consisting of copper, nickel, tungsten, and molybdenum. According to a particularly preferred embodiment, the metal is copper with a melting point of at least 700° C. According to a further preferred embodiment, the solder material comprises a metal component (i) which contains a metal having a melting point of at least 700° C. According to a particularly preferred embodiment, the solder material comprises a metal component (i) which contains copper. According to a further preferred embodiment, metal component (i) is copper.

The solder material comprises (i) a metal having a melting point of less than 700° C. The metal having a melting point of less than 700° C. preferably has a melting point of less than 600° C., and particularly preferably a melting point of less than 550° C. According to a preferred embodiment, the metal having a melting point of less than 700° C. is selected from the group consisting of tin, bismuth, indium, gallium, zinc, antimony, and magnesium. According to a particularly preferred embodiment, the metal is tin with a melting point of less than 700° C. According to a further preferred embodiment, the solder material comprises a metal component (ii) which contains a metal having a melting point of less than 700° C. According to a particularly preferred embodiment, the metal component (ii) is an alloy of a metal having a melting point of less than 700° C. with a further metal. The further metal may, for example, be selected from the group consisting of metals having a melting point of less than 700° C., metals having a melting point of at least 700° C., and active metals. According to a further preferred embodiment, the metal component (ii) containing a metal having a melting point of less than 700° C. is selected from the group consisting of tin, bismuth, indium, gallium, zinc, antimony, magnesium, tin-copper alloys, tin-bismuth alloys, tin-antimony alloys, tin-zinc-bismuth alloys, and indium-tin alloys. According to a further particularly preferred embodiment, the metal component (ii) containing a metal having a melting point of less than 700° C. is selected from the group consisting of tin, tin-copper alloys, tin-bismuth alloys, tin-antimony alloys, tin-zinc-bismuth alloys, and indium-tin alloys.

The solder material comprises an active metal. The active metal is preferably a metal which, by chemical reaction, produces a bond between the solder, formed from components of the solder material, and the ceramic. According to a preferred embodiment, the active metal is selected from the group consisting of hafnium, titanium, zirconium, niobium, tantalum, vanadium, and cerium. According to a more preferred embodiment, the active metal is selected from the group consisting of hafnium, titanium, zirconium, niobium, and cerium. According to a particularly preferred embodiment, the active metal is selected from the group consisting of hafnium, titanium, and zirconium. According to an especially preferred embodiment, the active metal is titanium. According to a further preferred embodiment, the solder material comprises a metal component (iii) which contains an active metal. According to a particularly preferred embodiment, the metal component (iii) is an active metal alloy or an active metal compound, particularly preferably an active metal hydride. The metal component (iii) is preferably selected from the group consisting of titanium hydride, titanium-zirconium-copper alloys, zirconium hydride, and hafnium hydride. According to a particularly preferred embodiment, the metal component (iii) is selected from the group consisting of hafnium hydride, titanium hydride, and zirconium hydride. According to an especially preferred embodiment, the metal component (iii) is titanium hydride.

According to a preferred embodiment, the proportion of the metal with a melting point of at least 700° C. is 50-90 percent by weight, more preferably 55-90 percent by weight, particularly preferably 65-90 percent by weight, and especially preferably 70-90 percent by weight, relative to the total metal weight of the solder material. According to a further preferred embodiment, the proportion of the metal with a melting point of less than 700° C. is 5-45 percent by weight, more preferably 5-40 percent by weight, particularly preferably 5-30 percent by weight, and especially preferably 5-25 percent by weight, relative to the total metal weight of the solder material. According to yet another preferred embodiment, the proportion of the active metal is 1-20 percent by weight, more preferably 1-15 percent by weight, particularly preferably 1-12 percent by weight, and especially preferably 1-10 percent by weight, relative to the total metal weight of the solder material.

The solder material is preferably silver-free or low in silver. Therefore, the proportion of silver is preferably less than 3.0 percent by weight, particularly preferably less than 1.0 percent by weight, and especially preferably less than 0.2 percent by weight, relative to the total metal weight of the solder material. Due to the absence of silver or the presence of only small amounts of silver, a migration of silver at the edges of the bonding layer in the finished metal-ceramic substrate can be avoided or reduced. Surprisingly, it has been found that the method according to the invention may also improve the current and thermal conductivity of metal-ceramic substrates with such a reduced silver content. This is surprising insofar as that, due to the replacement of silver as a solder base, such metal-ceramic substrates in practice represent an independent bonding class which has different material properties, which in part necessitates an adaptation with regard to the other solder components and modified joining conditions.

According to a further preferred embodiment, the solder material is low in silicon or silicon-free. Therefore, the proportion of silicon is preferably less than 3.0 percent by weight, more preferably less than 1.0 percent by weight, and especially preferably less than 0.5 percent by weight, relative to the total weight of all metals and semimetals in the solder material.

The solder material is in contact with the ceramic body and the metal foil. Accordingly, the solder material is preferably located between the ceramic body and the metal foil. For example, the solder material may be provided on the ceramic body, and then the metal foil may be applied onto the solder material. The solder material is preferably at least one material selected from the group consisting of pastes, films, and deposits which have a metal with a melting point of at least 700° C., a metal with a melting point of less than 700° C., and an active metal. The solder material can therefore also be formed from two or more materials of different composition. For example, a first material that is preferably directly in contact with the ceramic body may have a metal component (iii) containing an active metal, and a second material, preferably arranged between the first material and the metal foil, may have a metal component (i) containing a metal having a melting point of at least 700° C. and metal component (ii) containing a metal having a melting point of less than 700° C.

The solder material may be a paste. The paste preferably contains: (a) at least one metal component which has a metal having a melting point of at least 700° C., a metal having a melting point of less than 700° C., and an active metal; and (b) an organic medium.

The organic medium is preferably an organic medium which is typically used in the respective technical field. The organic medium preferably contains an organic binder, an organic dispersion medium, or a mixture thereof.

The organic binder is preferably removed from the solder material upon heating. The organic binder preferably involves thermoplastics or thermosets. Examples of organic binders include cellulose derivatives (such as ethylcellulose, butylcellulose, and cellulose acetates), polyethers (such as polyoxymethylene), and acrylic resins (such as polymethyl methacrylates and polybutylene methacrylates).

The organic dispersion medium is preferably an organic compound which imparts a suitable viscosity to the paste and is expelled upon drying of the paste or upon heating. The organic dispersion medium can, for example, be selected from aliphatic alcohols, terpene alcohols, alicyclic alcohols, aromatic cyclic carboxylic esters, aliphatic esters, carbitols, and aliphatic polyols. Examples of the organic dispersion medium include octanol, decanol, terpineols (for example dihydroterpineol), cyclohexanol, dibutyl phthalate, carbitol, ethylcarbitol, ethylene glycol, butanediol, and glycerol.

Moreover, the paste can contain customary additives. Examples of such additives include inorganic binders (such as glass frits), stabilizers, surfactants, dispersants, rheology modifiers, wetting aids, defoamers, fillers, and hardeners.

According to a preferred embodiment, the proportion of the at least one metal component which has a metal with a melting point of at least 700° C., a metal having a melting point of less than 700° C., and an active metal is 20-95 percent by weight, more preferably 30-95 percent by weight, and particularly preferably 75-95 percent by weight, relative to the total weight of the paste. According to a further preferred embodiment, the proportion of the organic medium is 5-80 percent by weight, more preferably 5-70 percent by weight, and particularly preferably 5-25 percent by weight, relative to the total weight of the paste.

According to a further preferred embodiment, the ratio of the total weight of the (a) at least one metal component, which has a metal having a melting point of at least 700° C., a metal having a melting point of less than 700° C., and an active metal, to the weight of the (b) organic medium, is at least 5:1, particularly preferably at least 7:1, and especially preferably at least 8:1. According to a further preferred embodiment, the ratio of the total weight of the (a) at least one metal component, which has a metal having a melting point of at least 700° C., a metal having a melting point of less than 700° C., and an active metal, to the weight of the (b) organic medium, is in the range of 1:1 to 20:1, particularly preferably in the range of 2:1 to 20:1, and especially preferably in the range of 5:1 to 15:1.

To provide the stack, the paste is preferably applied onto the surface of the ceramic body. The paste may, for example, be applied via a dispersing process or a printing process. Suitable printing methods are, for example, screen printing methods, inkjet printing methods, and offset printing methods. The paste is preferably applied onto the surface of the ceramic body via a screen printing method.

After the paste application, the paste may be pre-dried as necessary. The pre-drying may take place at room temperature or at elevated temperature. The conditions for the pre-drying may vary depending on the organic medium contained in the paste. The pre-drying temperature may, for example, be in a range from 50-180° C., and is preferably in a range from 80-150° C. The pre-drying usually takes place for a time period of 2 min-2 h, and preferably for a period of 5 min-1 h.

The metal foil can subsequently be applied with its surface onto the paste, which is pre-dried as necessary, to obtain a stack.

The solder material may also be a film.

The film comprises (i) a metal having a melting point of at least 700° C., (ii) a metal having a melting point of less than 700° C., and (iii) an active metal. In addition, the film may comprise further components such as, for example, a suitable binder.

The film can be obtained, for example, in that at least one metal component having a metal having a melting point of at least 700° C., a metal having a melting point of less than 700° C., and an active metal, and optionally further constituents, are homogenized and heated to a temperature which is below the melting temperature of the metal with a melting point of at least 700° C., of the metal having a melting point of less than 700° C., and of the active metal, but which is sufficient to form a bond between the metals. This temperature may be at least 200° C., for example.

Alternatively, the film may be obtained, for example, in that at least one metal component having a metal with a melting point of at least 700° C., a metal having a melting point of less than 700° C., and an active metal, and a binder, are mixed, and the mixture is formed into a green body and heated. Upon heating, the binder may cure and form a matrix in which the metals are distributed.

To provide the stack, the film may be placed on the ceramic, for example. The metal foil may subsequently be applied with its surface onto the film located on the ceramic, in order to obtain a stack.

According to a further embodiment, the solder material may be a deposition. The deposition of the solder material may, for example, be generated via galvanic deposition or chemical vapor deposition. The deposition of the solder material is preferably generated on the ceramic body. Thereafter, the metal foil may be applied onto the solder material deposited on the ceramic, in order to obtain a stack.

The heating of the stack preferably takes place to obtain a metal-ceramic substrate. According to a preferred embodiment, the heating takes place, wherein a metal-ceramic substrate is obtained with formation of a material bond between the ceramic body and the metal foil via the solder material. The formation of the material bond preferably takes place in that the active metal enters into a bond with the ceramic body, and the metal having a melting point of at least 700° C., the metal having a melting point of less than 700° C., and the metal of the metal foil are connected to form an alloy. Upon subsequent solidification, a material bond is formed between the ceramic body and the metal foil via the solder material.

The heating of the stack preferably takes place in such a way that a material bond between the ceramic body and the metal foil is produced via the solder material.

Upon heating the stack, at least one, particularly preferably at least two of the conditions (i.e. the conditions b1 and b2 or the conditions b1 and b3 or the conditions b2 and b3), and especially preferably all of the following conditions, are satisfied:

b1) the high temperature heating duration is no more than 60 min, wherein the high temperature heating duration refers to the duration in which the stack is exposed, upon heating, to a temperature that corresponds to at least the peak temperature −250° C.;

b2) the peak temperature heating duration is no more than 30 min, wherein the peak temperature heating duration refers to the duration in which the stack is exposed, upon heating, to a temperature that corresponds to at least the peak temperature −50° C.;

b3) the heating duration is no more than 60 min, wherein the heating duration denotes the period of time that the stack needs to reach the peak temperature, starting from a temperature of 100° C.

Upon heating, the stack is heated to a peak temperature. The peak temperature is not further restricted and is preferably less than or equal to the melting point of the metal with a melting point of at least 700° C., and lower than the melting point of the metal of the metal foil. According to a preferred embodiment, the peak temperature is at least 10° C. and particularly preferably at least 50° C. below the melting point of the metal of the metal foil. According to a further preferred embodiment, the peak temperature is at least 700° C. The peak temperature is preferably in the range from 700-1100° C., particularly preferably in the range from 750-1050° C., and especially preferably in the range from 800-1000° C. As used herein, the peak temperature refers to the temperature measured at the stack by means of a thermocouple. The peak temperature is thereby the maximum temperature measured at the stack. In order to prevent disadvantageous effects, such as excessive contraction or oozing of the molten metal due to too high a fluidity of the molten metal, the skilled person will seek to avoid excessively high peak temperatures.

Upon heating, the stack experiences a temperature charging for a heating duration. Herein, the heating duration preferably refers to the time period in which the stack is exposed to a temperature of at least 200° C. upon heating. The heating duration is not further restricted as long as it is sufficient to ensure a wetting of the surfaces to be connected and their material availability. According to a preferred embodiment, the heating duration is at least 5 min, and particularly preferably at least 10 min. According to a further preferred embodiment, the heating duration is not more than 5 h, particularly preferably not more than 2 h, and especially preferably not more than 90 min. The heating duration is preferably in the range from 5 min-5 h, particularly preferably in the range from 5 min-2 h, and especially preferably in the range from 10-90 min.

Upon heating, the stack experiences a temperature charging for a high temperature heating duration. Herein, the high temperature heating duration preferably refers to the duration in which the stack is exposed, upon heating, to a temperature that corresponds to at least the peak temperature −250° C. Given an exemplary peak temperature of 900° C., the high temperature heating duration therefore corresponds to the duration in which the stack is exposed to at least a temperature of 650° C. upon heating. According to a preferred embodiment (condition b1), the high temperature heating duration is not more than 60 min, more preferably not more than 50 min, particularly preferably not more than 45 min, and especially preferably not more than 40 min. The high temperature heating duration is preferably in the range from 2-60 min, more preferably in the range from 3-50 min, particularly preferably in the range from 5-45 min, and especially preferably in the range from 10-40 min.

Upon heating, the stack experiences a temperature charging for a peak temperature heating duration. Herein, the peak temperature heating duration preferably refers to the duration in which the stack is exposed, upon heating, to a temperature that corresponds to at least the peak temperature −50° C. Given an exemplary peak temperature of 900° C., the peak temperature heating duration therefore corresponds to the duration in which the stack is exposed to at least a temperature of 850° C. upon heating. According to a preferred embodiment (condition b2), the peak temperature heating duration is not more than 30 min, more preferably not more than 25 min, particularly preferably not more than 20 min, and especially preferably not more than 15 min. The peak temperature heating duration is preferably in the range from 1-30 min, more preferably in the range from 1-25 min, particularly preferably in the range from 2-20 min, and especially preferably in the range from 3-15 min.

According to a further particularly preferred embodiment, the high temperature heating duration is in the range from 10-40 min, and the peak temperature heating duration is in the range from 3-15 min.

According to a further preferred embodiment, the ratio of peak temperature heating duration (in min) to heating duration (in min) is not more than 1:2. The ratio of peak temperature heating duration (in min) to heating duration (in min) is preferably in the range of 1:2 to 1:15, more preferably in the range of 1:2 to 1:10, particularly preferably in the range of 1:2 to 1:7, and especially preferably in the range of 1:3 to 1:6. Surprisingly, it has been found that the thermal and current conductivity of the metal-ceramic substrates may be further improved given a ratio of peak temperature heating duration (in min) to heating duration (in min) in the specified range.

Upon heating, a temperature charging takes place for a heating duration. The heating duration thereby preferably denotes the time period which the stack requires in order to achieve the peak temperature starting from a temperature of 100° C. According to a preferred embodiment (condition b3), the heating duration is not more than 60 min, particularly preferably not more than 45 min, and especially preferably not more than 30 min. The heating duration is preferably in the range from 1-60 min, more preferably in the range from 5-45 min, and particularly preferably in the range from 10-30 min.

Surprisingly, it has turned out that a metal-ceramic substrate with an improved thermal and current conductivity may be obtained if the stack is heated and at least one of the conditions b1, b2, and b3 is thereby satisfied, accordingly a high temperature heating duration of 60 min is not exceeded, a peak temperature of 30 min is not exceeded, and/or a heating duration of 60 min is not exceeded.

Without wishing to be bound by theory, this could be ascribed to the fact that the stack experiences only a limited energy input at a low high temperature heating duration, a low peak temperature heating duration, and/or a low heating duration, which limited energy input is sufficient to produce a material bond between the ceramic body and the metal foil via the solder material but which, on the other hand, is limited so that an excessive diffusion of metals with a melting point of at least 700° C. and metals with a melting point of less than 700° C. into the metal foil is avoided. This reduced diffusion could in turn be causative for the improved current and thermal conductivity in the finished metal-ceramic substrate.

The stack is preferably heated in that, starting from a heating zone, the energy input required for heating takes place in the direction of the stack. The formation of the material bond preferably takes place in that the active metal enters into a bond with the ceramic body, and the metal having a melting point of at least 700° C., the metal having a melting point of less than 700° C., and the metal of the metal foil are connected to form an alloy. Upon subsequent solidification, a material bond is formed between the ceramic body and the metal foil via the solder material.

The arrangement of stack and heating zone is not further restricted.

Stack and heating zone may respectively be arranged statically.

On the other hand, it may be preferred that the stack passes a heating zone for heating.

According to this preferred embodiment, in the heating zone conditions prevail which enable the formation of a material bond between the ceramic and the metal foil via the solder material. The temperature and atmosphere present in the heating zone are preferably adjustable. The heating zone preferably has an inlet and an outlet. Upon passing the heating zone, the stack preferably enters into the heating zone via the inlet and exits from the heating zone via the outlet. The inlet is preferably different from the outlet.

According to a further preferred embodiment, the stack and the heating zone are arranged such that the position of the stack relative to the position of the heating zone can be changed in order to enable the stack to pass the heating zone. The distance between the stack and the heating zone preferably decreases before the passage of the heating zone, reaches a minimum upon passage of the heating zone, and increases after passage of the heating zone. According to a preferred embodiment, a relative movement of stack and heating zone takes place, wherein stack and heating zone initially perform a relative movement with respect to one another, and execute a relative movement away from one another after passing. For this purpose, the stack may be arranged in a stationary manner and the heating zone may be arranged so as to be mobile, the stack may be arranged so as to be mobile and the heating zone may be arranged in a stationary manner, or the stack and heating zone may be arranged so as to be mobile.

Upon passing the heating zone, the stack therefore preferably experiences a temperature charging. Accordingly, upon passing, the stack is at a distance from the heating zone which ensures a temperature increase required for the formation of a material bond between the ceramic body and the metal foil.

Surprisingly, it has turned out that a metal-ceramic substrate with a further improved thermal and current conductivity can be obtained if the stack passes a heating zone upon heating. Without wishing to be bound by theory, this could be ascribed to the fact that a passage of the heating zone allows a targeted control of the energy input. If the stack passes the heating zone, the temperature in the heating zone and the speed at which the stack passes the heating zone may be ideally matched to the structure and the dimension of the stack, so that only the energy input required for the formation of a material bond between the ceramic body and the metal foil takes place. This prevents an excessively strong energy input, which regularly leads to an increased diffusion of metals with a melting point of at least 700° C. and metals with a melting point of less than 700° C. into the metal foil, which may ultimately be causative of a decrease in the current and thermal conductivity in the finished metal-ceramic substrate. Furthermore, a uniform distribution of the temperature and of the gases (for example inert gases) contained in the heating zone is ensured upon passage of the heating zone. As a result, when a plurality of metal-ceramic substrates are produced using the method according to the invention, a lower variation of the quality of the produced metal-ceramic substrates occurs in comparison to conventional methods (for example using a batch furnace). In this respect, a relative movement of the stack in the direction of a heating zone, wherein the stack passes the heating zone, has turned out to be advantageous as compared to the stationary heating (for example in a batch furnace).

According to a particularly preferred embodiment, the heating of the stack takes place in a furnace, preferably in a continuous furnace.

The furnace preferably has a heating zone and a carrier system. The stack is preferably arranged on the carrier system. The heating zone and the carrier system are preferably designed such that the position of the stack relative to the position of the heating zone can be changed in order to allow a heating of the stack while passing the heating zone. The heating zone and the carrier system are therefore preferably designed in such a way that the distance between the stack and the heating zone can be reduced until the distance upon passing the heating zone assumes a minimum, and the distance can be increased after passing the heating zone. According to a preferred embodiment, the heating zone and the carrier system are therefore designed for a relative movement so that stack and heating zone initially perform a relative movement with respect to one another, and execute a relative movement away from one another after passing.

The furnace may preferably be a continuous furnace. According to a preferred embodiment, the heating of the stack accordingly takes place in a continuous furnace, wherein the stack passes the heating zone of the continuous furnace upon heating. A continuous furnace preferably has at least one heating zone and, for example, a revolving conveyor chain, a transport system roller, or a transport slide system as a carrier system on which a workpiece may be transported through the heating zone. In the transport direction before the heating zone and after the heating zone, further zones may be located in the continuous furnace. It may thus be advantageous that a cooling zone is located after the heating zone in the continuous furnace. Moreover, it may be advantageous that gas inlets and gas outlets, via which a supplying of the zones with gas (for example an inert gas such as nitrogen) may take place, are located in the heating zone and the optionally present further zones. Such continuous furnaces are sufficiently known from the prior art (see for example DE 4008979 C1 and EP 0085914 A2).

According to a preferred embodiment of the method according to the invention, the stack is initially applied onto a substrate. The substrate may be made of silicon carbide, for example. The substrate made of silicon carbide may be provided with a further coating, for example a graphite foil.

The stack—preferably arranged on a substrate—is subsequently preferably placed on a carrier system, for example a conveyor belt. The conveyor belt may, for example, be a conveyor chain, a transport roller system, or a transport slide system of a continuous furnace.

According to a preferred embodiment, the stack passes the heating zone on the carrier system. The carrier system is preferably driven, for example via rollers.

A non-oxidizing atmosphere is preferably present in the heating zone. The non-oxidizing atmosphere is preferably an inert gas atmosphere. A nitrogen atmosphere, a helium atmosphere, or an argon atmosphere is preferably present in the heating zone. According to a particularly preferred embodiment, a nitrogen atmosphere is present in the heating zone. The proportion of a reactive gas, in particular oxygen, in the non-oxidizing atmosphere is preferably less than 1000 ppm, more preferably less than 500 ppm, and particularly preferably less than 40 ppm.

The formation of a material bond between the ceramic body and the metal foil via the solder material to obtain a metal-ceramic substrate preferably takes place upon heating the stack. The metal-ceramic substrate may be subjected to further treatment steps as necessary. For example, the metal-ceramic substrate, preferably the exposed surface of the metal foil of the metal-ceramic substrate, may be polished. The surface of the metal foil of the metal-ceramic substrate is preferably physically or chemically polished. The metal-ceramic substrate may also be structured. For example, the metal-ceramic substrate may be provided with conductor traces. The conductor traces are preferably produced by etching.

The metal-ceramic substrate produced according to the invention may be used in particular for applications in electronics, especially in the field of power electronics.

In the examples, metal-ceramic substrates were produced under various conditions. A respective stack, containing a ceramic body, a metal foil, and a solder material in contact with the ceramic body and the metal foil, was thereby provided and subsequently heated. The solder material was a standard paste containing copper, tin, and titanium as metals. The current and thermal conductivity were then evaluated qualitatively. Comparable results can also be achieved with other material combinations.

For the production of metal-ceramic substrates, 31.67 percent by weight of SnCu0.7 powder, 7.24 percent by weight of titanium hydride, and 9.50 percent by weight of an organic vehicle containing Texanol were initially mixed at 35 Hz for 20 minutes in a stand mixer. Thereafter, 51.59 percent by weight of copper powder was added in increments. The mixture thus produced was stirred at high speed until a homogeneous paste was obtained.

With the paste produced in this way, ceramic bodies were joined on their opposite surfaces to copper foils on both sides. For this purpose, respective ceramic bodies with dimensions 177.8×139.7×0.32 mm (obtained from Toshiba Materials) were used which had an identical front and rear side procurement. The paste was screen-printed by means of a 165 mesh screen to a region of dimensions 137×175 mm$^2$ on the rear side of such a ceramic body and pre-dried at 125° C. for 15 minutes. The paste thickness after pre-drying was 35+/−5 µm. Thereafter, the arrangement thus produced was turned around, the paste likewise printed on the front side of the ceramic body and pre-dried. Subsequently, the ceramic provided with paste on both sides was provided on both sides with copper foil made of oxygen-free, highly conductive copper having a purity of 99.99% and dimensions of 174×137×0.3 mm in order to obtain a stack with the following structure: Copper foil—pre-dried paste—ceramic—pre-dried paste—copper foil.

The stack was then heated in a continuous furnace. For this purpose, firstly a silicon carbide plate, onto which a graphite foil was applied, was placed on the conveyor chain of a continuous furnace. The stack was placed on the graphite foil, which stack was then covered with a further graphite foil and weighted with a further silicon carbide plate (weight=600 g). The structure was subsequently transported on the conveyor chain through the heating zone of a continuous furnace. The peak temperature (measured at the stack with a type K thermocouple from the company Temperatur Messelemente Hettstedt GmbH) was 935° C. and the heating duration was 17 min. The heating duration was 29.5 min, the high temperature heating duration was 13 min, and the peak temperature heating duration was 6.5 min. The metal-ceramic substrate thus obtained was subsequently cooled to room temperature in order to obtain a metal-ceramic substrate which contained a ceramic layer that was connected on both sides to a copper layer via a bonding layer.

Example 2 was implemented analogously to Example 1, with changed heating parameters. The peak temperature (measured at the stack with a type K thermocouple from the company Temperatur Messelemente Hettstedt GmbH) was 910° C. and the heating duration was 21.5 min. The heating duration was 41 min, the high temperature heating duration was 17 min, and the peak temperature heating duration was 7 min.

The comparative example was implemented analogously to Example 1, wherein, however, the stack was heated in a batch furnace instead of in a continuous furnace. The peak temperature (measured at the stack with a type K thermocouple from the company Temperatur Messelemente Hettstedt GmbH) was 910° C. and the heating duration was 230 min. The heating duration was 380 min, the high temperature heating duration was 120 min, and the peak temperature heating duration was 35 min. The metal-ceramic substrate thus obtained was subsequently cooled to room temperature in order to obtain a metal-ceramic substrate which contained a ceramic layer that was connected on both sides to a copper layer via a bonding layer.

The thermal and current conductivity of the metal-ceramic substrates obtained in the examples was subsequently evaluated as follows:

| Example | Conductivity |
| --- | --- |
| Example 1 | High |
| Example 2 | High |
| Comparative example | Low |

It was found that the conductivity of metal-ceramic substrates can be markedly improved given application of the method according to the invention. Without wishing to be bound by theory, this could be ascribed to the fact that the metal with a melting point of less than 700° C. (tin, in the examples) penetrates less deeply into the metal foil in the method according to the invention than is the case given conventional methods. It could thus be shown that the metal with a melting point of less than 700° C. (tin, in the examples) penetrates less deeply into the metal foil in the method according to the invention than is the case given conventional methods. For the metal-ceramic substrates obtained in Examples 1 and 2, a depth profile analysis yielded a diffusion of tin into the copper foil that was reduced by more than 30% compared to the metal-ceramic substrate of the comparative example. Consequently, in Examples 1 and 2, the conductivity of the finished metal-ceramic substrate is less strongly impaired.

The invention claimed is:

1. A method for producing a metal-ceramic substrate, the method comprising:
    a) providing a stack comprising:
        a1) a ceramic body,
        a2) a metal foil, and
        a3) a solder material in contact with the ceramic body and the metal foil, wherein the solder material comprises:
            (i) a metal having a melting point of at least 700° C.,
            (ii) a metal having a melting point of less than 700° C., and
            (iii) an active metal; and
    b) heating the stack, wherein at least one of the following conditions is satisfied:
        b1) a high temperature heating duration is no more than 60 min, wherein the high temperature heating duration refers to the duration in which the stack is exposed, upon heating, to a temperature that corresponds to at least a peak temperature minus 250° C.;
        b2) a peak temperature heating duration is no more than 30 min, wherein the peak temperature heating duration refers to the duration in which the stack is exposed, upon heating, to a temperature that corresponds to at least the peak temperature minus 50° C.; and
        b3) a heating duration is no more than 60 min, wherein the heating duration denotes the period of time that the stack needs to reach the peak temperature, starting from a temperature of 100° C.

2. The method according to claim 1, wherein the ceramic of the ceramic body is selected from the group consisting of aluminum nitride ceramics, silicon nitride ceramics, and aluminum oxide ceramics.

3. The method according to claim 1, wherein the metal of the metal foil is copper.

4. The method according to claim 1, wherein the solder material is a paste which comprises (a) at least one metal component having the metal with a melting point of at least 700° C., the metal with a melting point of less than 700° C., and the active metal, and (b) an organic medium.

5. The method according to claim 1, wherein the metal having a melting point of at least 700° C. is copper.

6. The method according to claim 1, wherein the metal having a melting point of less than 700° C. is selected from the group consisting of tin, bismuth, indium, gallium, zinc, antimony, and magnesium.

7. The method according to claim 1, wherein the active metal is selected from the group consisting of hafnium, titanium, zirconium, niobium, tantalum, vanadium, and cerium.

8. The method according to claim 1, wherein the solder material has less than 3.0 percent by weight of silver.

9. The method according to claim 1, wherein the stack is heated with a heating zone.

10. The method according to claim 9, wherein a non-oxidizing atmosphere is present in the heating zone.

11. The method according to claim 9, wherein a nitrogen atmosphere is present in the heating zone.

12. The method according to claim 1, wherein the heating the stack takes place in a continuous furnace.

13. The method according to claim 1, wherein the peak temperature is in the range of 700-1100° ° C.

14. The method according to claim 9, wherein the stack and the heating zone are arranged statically relative to each other.

15. The method according to claim 1, wherein the peak temperature is in the range of 900-935° ° C.

16. The method according to claim 4, wherein the solder material further comprises an inorganic binder.

17. The method according to claim 4, wherein the solder material further comprises one or more additives selected from the group consisting of stabilizers, surfactants, dispersants, rheology modifiers, wetting aids, defoamers, fillers, and hardeners.

18. The method according to claim 1, wherein the solder material has less than 3.0 percent by weight of silicon.

19. The method according to claim 1, wherein at least two of the conditions b1) through b3) are satisfied.

20. The method according to claim 1, wherein all three of the conditions b1) through b3) are satisfied.

* * * * *